United States Patent
Asai et al.

(10) Patent No.: US 6,815,326 B2
(45) Date of Patent: Nov. 9, 2004

(54) METHOD OF MANUFACTURING SEMICONDUCTOR ELECTRODE AND SEMICONDUCTOR DEVICE PROVIDED WITH ELECTRODES MANUFACTURED BY THE METHOD

(75) Inventors: Kouichi Asai, Nagoya (JP); Kazutoshi Sakai, Nagoya (JP); Kazuya Suzuki, Toyota (JP); Hirofumi Koike, Anjyo (JP); Shunji Yoshikane, Aichi (JP); Kenji Tanaka, Aichi (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 10/391,197

(22) Filed: Mar. 19, 2003

(65) Prior Publication Data

US 2004/0033683 A1 Feb. 19, 2004

(30) Foreign Application Priority Data

Mar. 20, 2002 (JP) ........................................ 2002-123258

(51) Int. Cl.⁷ ........................... H01L 21/44; H01L 23/48
(52) U.S. Cl. ........................ 438/613; 438/616; 438/671; 438/685; 438/686; 438/688; 257/737; 257/771; 257/785
(58) Field of Search .............................. 438/612, 613, 438/616, 669, 671, 674, 685, 686, 688; 257/737, 741, 768–771, 785

(56) References Cited

U.S. PATENT DOCUMENTS 5,888,847 A * 3/1999 Rostoker et al. ............ 438/688
6,007,923 A * 12/1999 Shimizu et al. ............. 428/586
6,706,130 B1 * 3/2004 Minamitani et al. .......... 156/64

OTHER PUBLICATIONS

C.Y. Chang, et al., Metal Deposition Techniques, ULSI Technology, 1996, pp. 379–395, MacGrawhill.

* cited by examiner

Primary Examiner—Kevin M. Picardat
(74) Attorney, Agent, or Firm—Foley & Lardner LLP

(57) ABSTRACT

An object of the present invention is to provide a technique for forming an ohmic connection between a semiconductor and a metal efficiently in a short period of time.

The present invention provides a method of forming at least one electrode on a surface of a semiconductor, wherein a metal or alloy for the electrode is rubbed against a predetermined region of the semiconductor surface so as to be adhered by frictional force and frictional heat to the predetermined region of the semiconductor as an electrode and part of the adhered metal or a metal of the alloy is diffused into an inside of the semiconductor by the frictional heat thereby to be formed into an ohmic electrode substantially simultaneously when the metal or alloy is adhered by the frictional force and frictional heat to the predetermined region of the semiconductor.

12 Claims, 7 Drawing Sheets

METHOD OF MANUFACTURING SEMICONDUCTOR ELECTRODE AND SEMICONDUCTOR DEVICE PROVIDED WITH ELECTRODES MANUFACTURED BY THE METHOD

BACKGROUND OF THE INVENTION

1. Field of the Invention

The present invention relates to a method of forming a semiconductor electrode on the surface of a semiconductor and a semiconductor device with electrodes formed by the method.

2. Description of the Related Art

The following technique has conventionally been adopted to form an ohmic contact between a metal electrode and a semiconductor.

An electrode material is deposited directly on a semiconductor, or an insulating film having a contact hole is formed on the semiconductor and the electrode material is deposited on the insulating film. An electrode forming process will be explained with reference to FIGS. 6A to 6C. First, an insulating film 10 such as oxide film is formed on a semiconductor substrate 20 and a portion of the insulating film 10 on which an electrode 13 is to be formed is eliminated by etching so that a contact hole 11 is formed. Secondly, an electrode material is deposited on the insulating film 10. A PVD (physical vapor deposition) apparatus such as sputtering apparatus or a CVD (chemical vapor deposition) is used for the deposition. Subsequently, a resist is applied to the overall electrode material, and the resist is exposed to light using a photomask to be developed so that a resist pattern is formed. The electrode material is processed by dry etching using the resist pattern so that an electrode 13 having a predetermined shape is formed at a position corresponding to a contact portion of the semiconductor substrate 20. Subsequently, part of a metal composing the electrode 13 is diffused into the contact portion of the semiconductor substrate 20. As the result of the diffusion, a mixed layer is formed in a boundary between the electrode 13 and the contact portion of the semiconductor substrate 20, whereby the electrode 13 and the contact portion of the semiconductor substrate 20 form an ohmic contact, thereby being formed into an ohmic electrode.

A large amount of impurities is previously introduced before the deposition of electrode material so that a high concentration impurity layer 12 of about $10^{20}$ cm$^{-3}$ is formed on the semiconductor substrate 20 on which an ohmic electrode is to be formed. Ion implantation, impurity deposition, etc. is employed for the impurity introduction and thereafter, a heat treatment is carried out so that the introduced impurities are activated or diffused.

In another method, a dopant metallic material which can serve as a donor or acceptor is deposited on the semiconductor substrate and thereafter, the dopant metallic material is sometimes diffused by heat treatment into the semiconductor substrate so that an N or P type layer.

A film former for forming an electrode forming material layer for the ohmic electrode on a semiconductor substrate includes PVD (physical vapor deposition) such as vapor deposition and sputtering, CVD (chemical vapor deposition). A document, "ULSI Technology" by C. Y. Chang, et al., MacGRAWHILL (1996), pp 379–395, describes such film formers in detail. A heat treatment such as sintering is thereafter applied to the semiconductor substrate on which the electrode forming material layer is formed. Consequently, the semiconductor material of the substrate is diffused into the electrode forming material layer to react therewith, whereupon an ohmic contact is formed.

In order that a desirable ohmic contact may be formed, a spontaneous oxide film present on the surface of the semiconductor needs to be removed. An etching step is required for removal of the spontaneous oxide film.

Furthermore, wire bonding in a semiconductor device is a primary example of an ohmic contact between a metal electrode and a metal, and both metals are connected together using an ultrasonic bonding which utilizes friction. In this case, the electrode metal serving as a backing is referred to as "bonding pad," whereas the metal connected to the metal electrode is referred to as "wire."

On the other hand, a method of directly bonding a metal to a semiconductor using the ultrasonic boding apparatus is scarcely used. The reason for this is that adhesiveness between the metal and a semiconductor is low and unpractical when the backing is the semiconductor.

As described above, the conventional method requires a number of steps in order that an ohmic electrode may be formed. More specifically, the conventional method requires an etching step removing a spontaneous oxide film on the semiconductor surface, a step for depositing an electrode material, a heat-treating step for sintering, an ion implanting step for forming an impurity layer in the semiconductor, etc. Accordingly, a period of time required for producing a semiconductor element is increased and hence increases the product cost.

Furthermore, an apparatus used in each step, for example, an ion implanting apparatus or a PVD apparatus is expensive equipment, thus increasing an equipment cost.

Additionally, a conventional wire bonding apparatus has often been used as means for connecting a metal wire and metal pad together in semiconductor chips. This apparatus connects the metal wire and metal pad together by frictional heat due to oscillation. However, in order that this may be applied to the connection of a semiconductor and a metal, the semiconductor surface needs to be provided with a region where a high concentration of impurities has been introduced. Even when the region is provided on the surface, it is difficult to ensure adhesiveness between a semiconductor and a metal, whereupon a desired ohmic characteristic cannot be achieved.

SUMMARY OF THE INVENTION

An object of the present invention is to provide a method of forming an ohmic connection between a semiconductor and a metal effectively in a short period of time without using expensive equipment which has been used in the conventional semiconductor preliminary treatment, the ohmic connection being difficult to be achieved by the wire bonding apparatus used in the conventional post-treatment, and a semiconductor device with electrodes formed by the method.

In order to achieve the object, the present invention provides a method of forming at least one electrode on a surface of a semiconductor, wherein a metal or alloy for the electrode is rubbed against a predetermined region of the semiconductor surface so as to be adhered by frictional force and frictional heat to the predetermined region of the semiconductor as an electrode and part of the adhered metal or a metal of the alloy is diffused into an inside of the semiconductor by the frictional heat thereby to be formed into an ohmic electrode substantially simultaneously when the metal or alloy is adhered by the frictional force and frictional heat to the predetermined region of the semiconductor.

In this case, the metal or alloy may be rotated so as to be brought into contact with the semiconductor surface as a technique for causing the frictional force and frictional heat. Furthermore, the metal or alloy for the electrode may be provided at least on an outer periphery of a rotator or may be formed into a brush shape.

Furthermore, the metal or alloy for the electrode may be provided at least on one side of a rotator.

Alternatively, the metal or alloy may be provided on an oscillator.

The metal for the electrode may become an n-type or p-type dopant.

In the present invention, the rotator or oscillator is operated at high speeds to be brought into contact with the semiconductor surface, whereby the metal or alloy for the electrode is adhered as an electrode to the semiconductor surface by the friction caused on a local part of the semiconductor surface, and local high frictional heat due to the high-speed operation results in effect of sintering. Consequently, an ohmic electrode can be formed.

Furthermore, when an impurity concentration on the semiconductor surface is increased so that an $n^+$ layer and a $p^+$ layer are formed, the $n^+$ layer and the $p^+$ layer can easily be formed on the semiconductor surface. Consequently, a high heat treatment such as sintering can be eliminated by the effect of frictional heat.

BRIEF DESCRIPTION OF THE DRAWINGS

Other objects, features and advantages of the present invention will become clear upon reviewing of the following description of the embodiments, made with reference to the accompanying drawings, in which.

DETAILED DESCRIPTION OF THE INVENTION

Figure 1A:
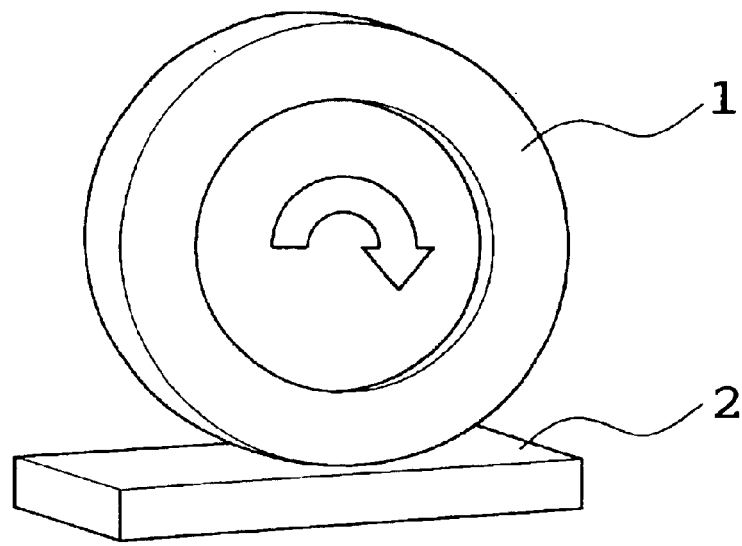
FIGS. 1A and 1B are typical perspective views of a first example and its modified form of an electrode adhering apparatus used in the present invention respectively.

Embodiments of the present invention will be described with reference to the drawings, which schematically show the invention to such a degree that the present invention will be understood. Accordingly, the present invention should not be limited to the examples shown in the drawings.

<First Embodiment>

Figure 1B:
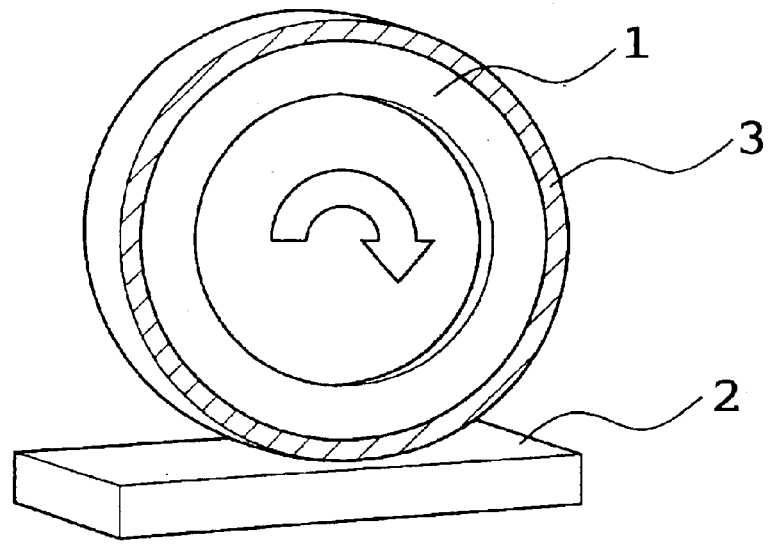

FIGS. 1A and 1B are typical perspective views of a first example and its modified form of an electrode adhering apparatus used in the present invention respectively. The electrode adhering apparatus is of the type that a rotator 1 is rotated. The rotator 1 is made of the same material as an electrode material (a metal or alloy) of an ohmic electrode which is to be formed on a semiconductor substrate 2. For example, Al (aluminum) may be used as the electrode material. Otherwise, any conductive metal used as an electrode material for a semiconductor element, such as gold, silver, platinum, copper, nickel, indium, titanium, etc. may be used.

The overall rotator 1 thus may be formed of the electrode material as shown in FIG. 1A but it is even good that at least an outer periphery of the rotator 1 is formed of the electrode material, as shown in FIG. 1B.

A method of providing the electrode material on the outer periphery 3 of the rotator 1 includes, for example, forming the electrode on the outer periphery of the rotator 1 by electroplating and mounting a ring-shaped electrode material on the outer periphery of the rotator 1.

The rotator 1 is brought into contact with the surface of the semiconductor substrate 2 while being rotated at high speeds. The rotator 1 used in the first example has a rotational speed of about 1200 rpm.

Frictional force and frictional heat are caused by friction between the rotator 1 and the semiconductor substrate 2, so that an oxide film 10 or spontaneous oxide film on a rubbed part of the surface of the semiconductor substrate 2 is removed and simultaneously, the electrode material of the rotator 1 is rubbed against the substrate surface thereby to adhere thereon. The rotational speed of the rotator 1 used in the first embodiment is a mere example and an optimum condition may be used according to the shape of a portion on which the electrode is formed, the shape of the rotator 1, etc.

Part of the metal adherent on the semiconductor substrate 2 is diffused into an inside of the semiconductor 2 by the frictional heat to be formed into an electrode.

A heat treatment such as sintering may be eliminated when a desired ohmic connection is provided between the metal and semiconductor by the effect of the frictional heat.

Figure 2:
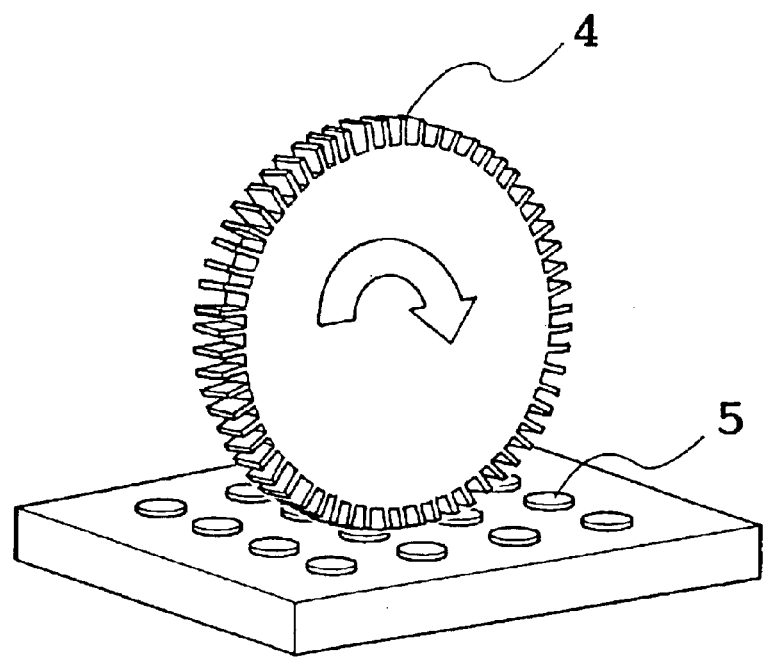
FIG. 2 is a typical perspective view of a second example of the electrode adhering apparatus used in the present invention.

FIG. 2 is a typical perspective view of a second example of the electrode adhering apparatus used in the present invention. A brush-shaped electrode material 4 is attached on an outer periphery of the rotator 1 of the electrode adhering apparatus. The brush-shaped electrode material 4 is formed of the same material as the material used in the explanation of FIG. 1.

The brush-shaped electrode material 4 has such a structure as to be suitable for the case where the electrode material is adhered to islanded deformed semiconductors 5 as shown in FIG. 2 or the like.

Figure 3:
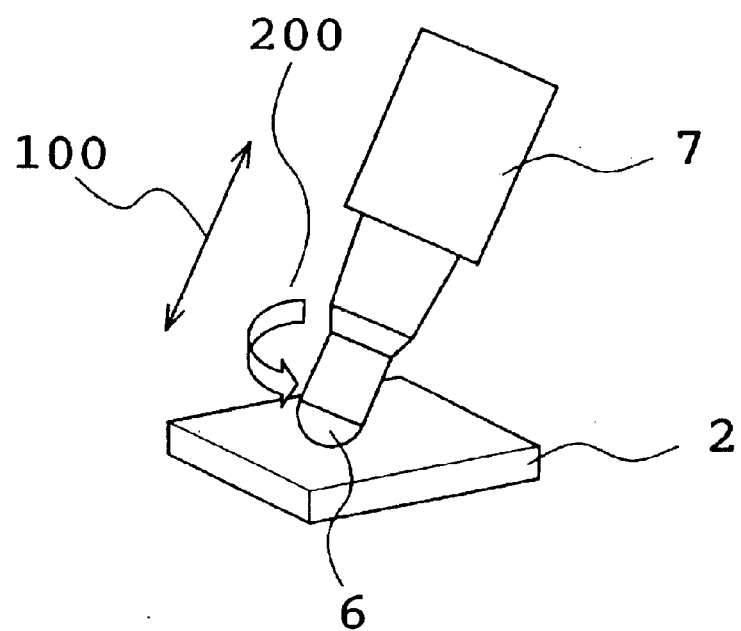
FIG. 3 is a typical perspective view of a third example of the electrode adhering apparatus used in the present invention.

FIG. 3 shows a third example of the electrode adhering apparatus used in the present invention. An oscillatory type electrode material 6 is oscillated in the following manner.

The oscillatory type electrode material 6 is attached to a distal end of an oscillation generator 7. The oscillatory type electrode material 6 is formed of the same material as the foregoing material used in the explanation of FIG. 1. The oscillatory type electrode material 6 is oscillated in a direction of arrow 100 or rotated in a direction of arrow 200 at high speeds. The oscillatory type electrode material 6 is brought into contact with the semiconductor substrate 2 so that the frictional force and the frictional heat are generated. The adhesion, diffusion and sintering of the electrode material are as described with reference to FIG. 1.

Figure 4A:
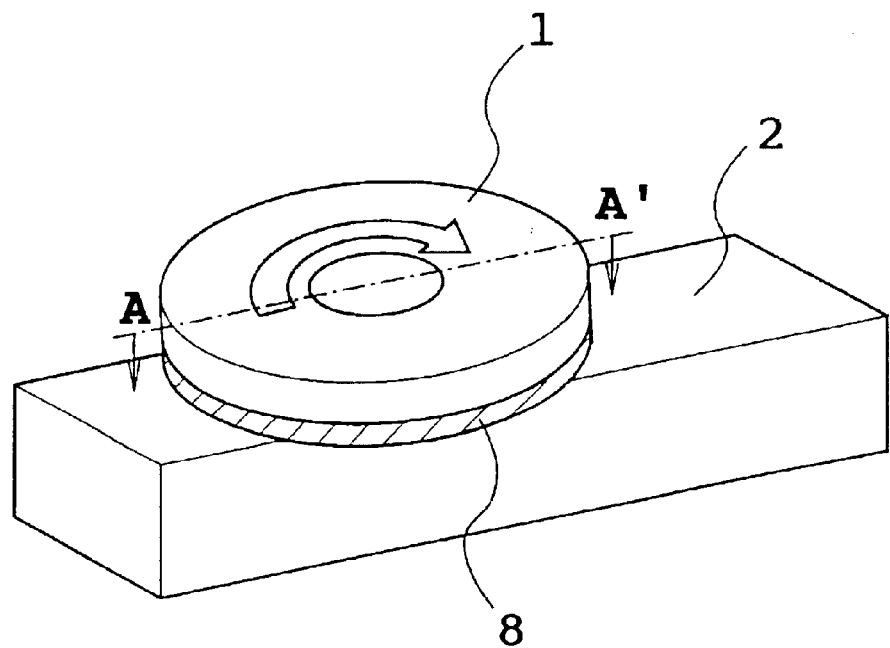
FIGS. 4A and 4B are a typical perspective view and a longitudinal section of a fourth example of the electrode adhering apparatus used in the present invention respectively.
Figure 4B:
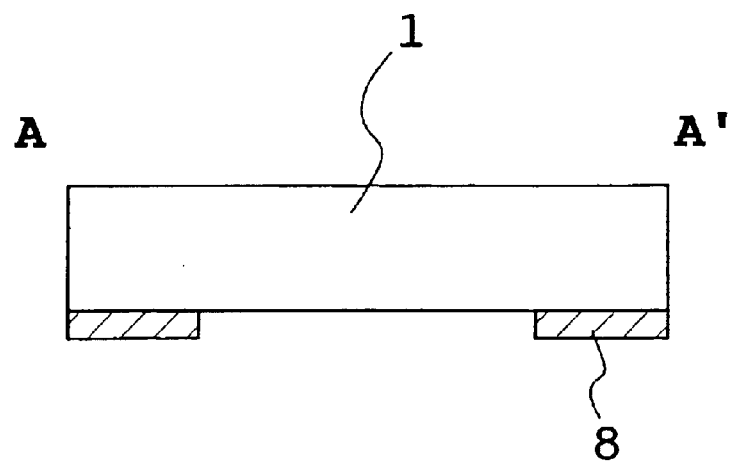

FIGS. 4A and 4B show a fourth example of the electrode adhering apparatus used in the present invention. A ring-shaped electrode material 8 is attached to one side of the rotator 1 as shown in FIG. 4A. FIG. 4B shows the attached electrode material 8.

Figure 5A:
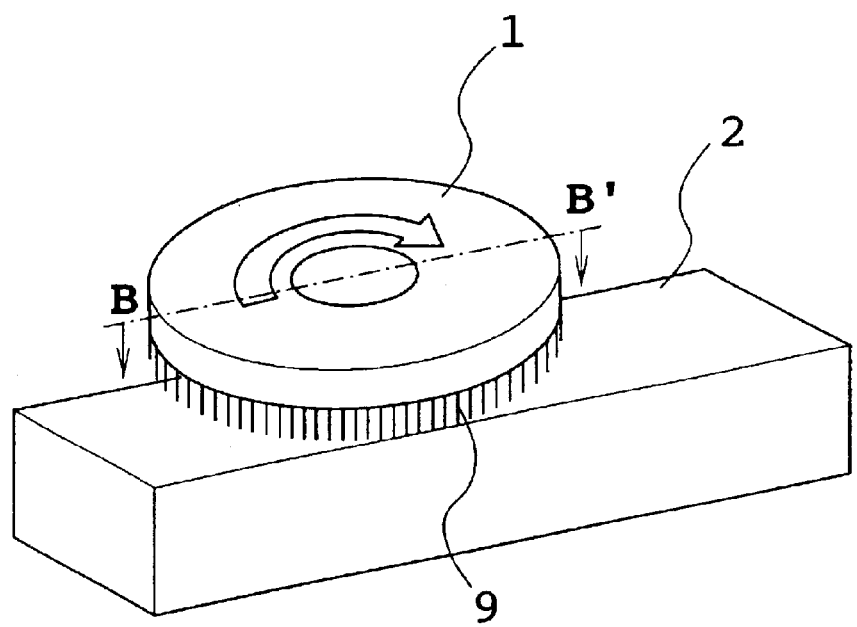
FIGS. 5A and 5B are a typical perspective view and a side view of a fifth example of the electrode adhering apparatus used in the present invention respectively.
Figure 5B:
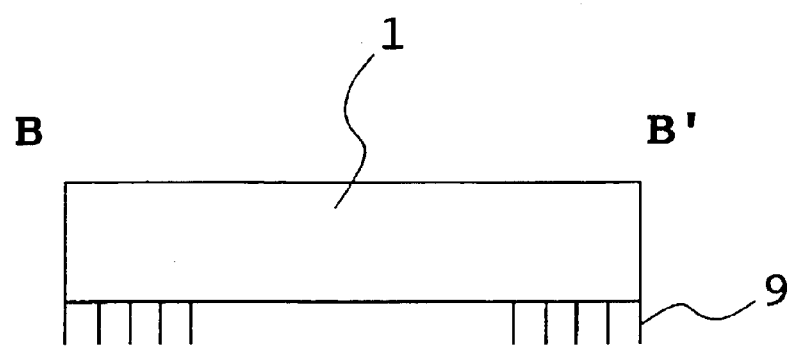

FIGS. 5A and 5B show a fifth example of the electrode adhering apparatus used in the present invention. A brush-shaped electrode material 9 is attached to one side of the rotator 1 as shown in FIG. 5A. FIG. 5B shows the longitudinal section of the attached electrode material 9.

The rotator 1 is rotated in a direction parallel to the semiconductor substrate 2 in each of cases of FIGS. 4 and 5.

Here, a conventional method of forming an ohmic electrode will be described with reference to FIGS. 6A to 6C.

Figure 6A:
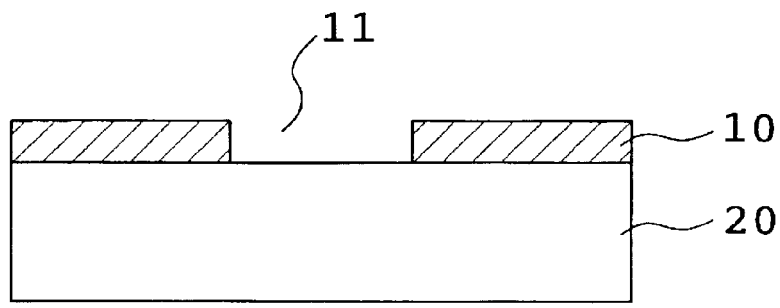
FIGS. 6A to 6C illustrate steps of a conventional ohmic electrode forming process.

FIG. 6A shows a semiconductor substrate 20 from which the oxide film 10 has been removed by etching. The substrate 20 has a predetermined region on which an electrode is to be formed. The predetermined region is formed with a contact hole 11. The etching is a wet etching using buffered HF or a dry etching using a gas such as $CH_4$. Patterning for the contact hole 11 is carried out using a usual photoprocess in which a photomask and resist are used.

Figure 6B:
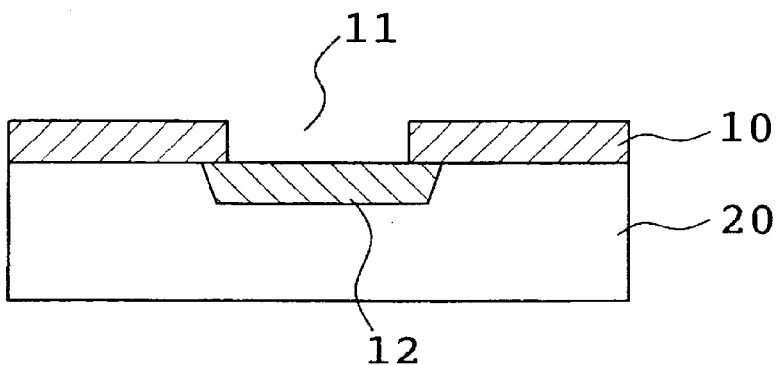

FIG. 6B shows a contact portion on which an electrode is to be formed. An n-type or p-type impurity layer 12 of high concentration is formed in the contact portion. The impurity layer 12 is introduced through the contact hole 11 to an inside of the semiconductor substrate 20 by ion implanting or deposition of impurity.

For example, phosphorus (P) or arsenic (As) is used for the n-type layer, whereas boron (B) is used for the p-type layer.

Thereafter, heat treatment is carried out so that a silicon layer is activated due to the ion implanting and the impurity is diffused. The deposition also requires heat treatment for diffusion of impurity.

Figure 6C:
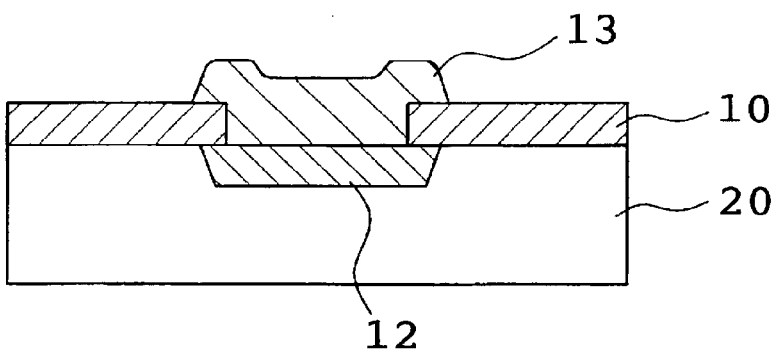

FIG. 6C shows an electrode 13 formed on the contact portion.

First, a desired metal is deposited as an electrode material, and thereafter, the electrode material is patterned into a predetermined shape using photolithographic or etching technique. A metal such as Al or Pt and an alloy such as AlSi, TiW or TiN are used.

Thereafter, a heat treatment in a temperature range of 400° C. to 500° C., such as sintering, is carried out so that the ohmic electrode 13 is formed on the high-concentration impurity layer 12 formed inside the semiconductor substrate 20.

As understood from the foregoing explanation, the conventional forming method requires a number of steps including the etching step, the metal depositing step, the step of introducing high concentration of impurity, the heat-treating step, etc., whereupon the production efficiency is low.

On the other hand, it is understood that the electrode forming method in accordance with the present invention can reduced the number of steps.

Figure 7A:
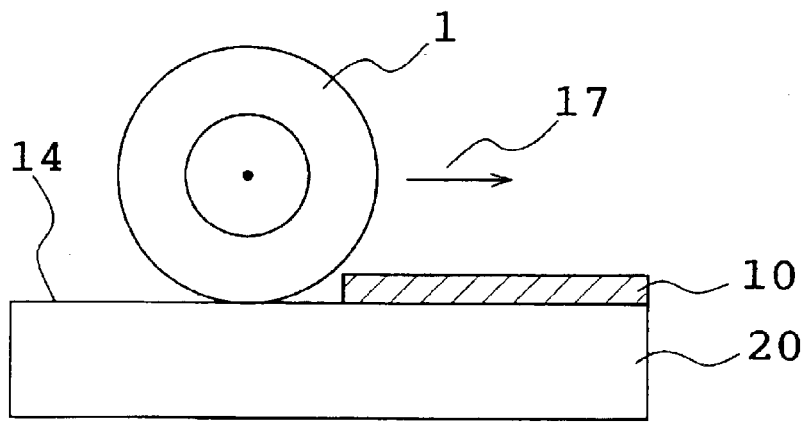
FIGS. 7A to 7C illustrate steps of an ohmic electrode forming process according to the first embodiment of the present invention.
Figure 7B:
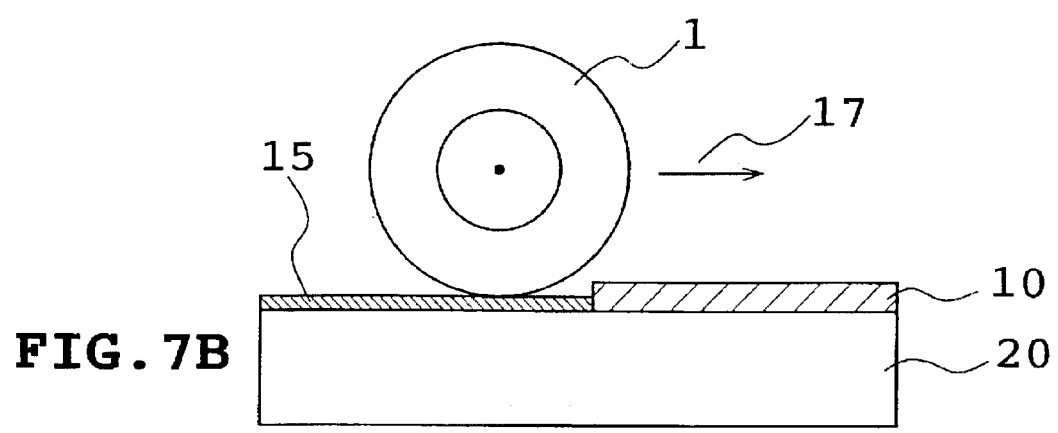
Figure 7C:
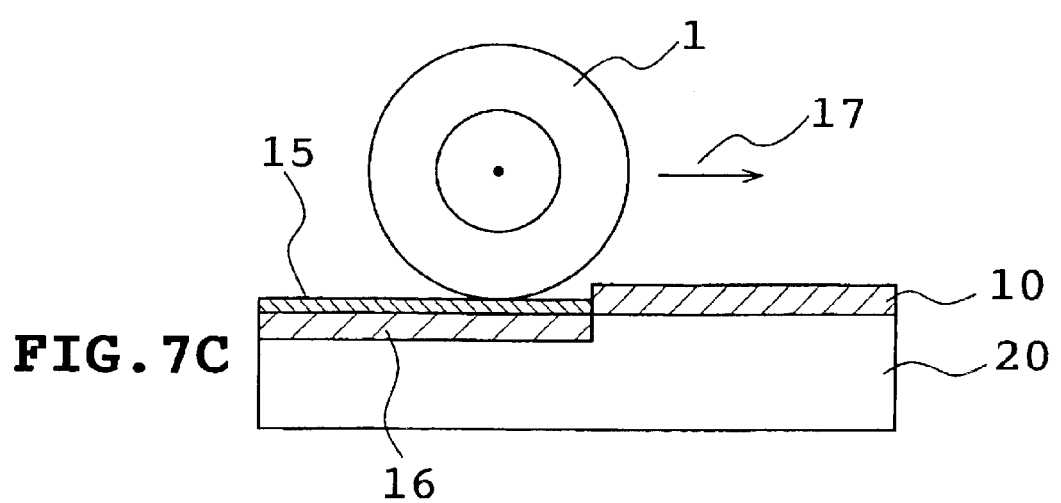

FIGS. 7A to 7C illustrate steps of an ohmic electrode forming process according to the first embodiment of the present invention.

First, FIG. 7A illustrates the step in which the rotator 1 as shown in FIG. 1A or 1B is rubbed against the surface of the semiconductor substrate 20 so that the oxide film 10 formed on the surface of the semiconductor substrate 20 is partially removed. In the removal of the oxide film, the rotator 1 is brought into contact with the surface of the semiconductor substrate 20 while being rotated at high speeds. Thus, the removal of oxide film is physically carried out by friction. In FIG. 7A, reference numeral 14 designates an exposed portion of the surface of the semiconductor substrate 20 from which the oxide film 10 has been removed.

FIG. 7B illustrates the step of adhering the electrode material 15 on the surface of the semiconductor substrate 20 from which the oxide film 10 has partially been removed.

FIG. 7C illustrates the state where part of the metal of the electrode material 15 adhered on the surface of the semiconductor substrate 20 is diffused inside the semiconductor substrate 20 by heat due to the friction between the rotator 1 and the semiconductor substrate 20.

Although the aforesaid steps of FIGS. 7A and 7B are actually executed substantially simultaneously, these steps are described in time sequence for the sake of convenience in the description.

<Second Embodiment>

Figure 8:
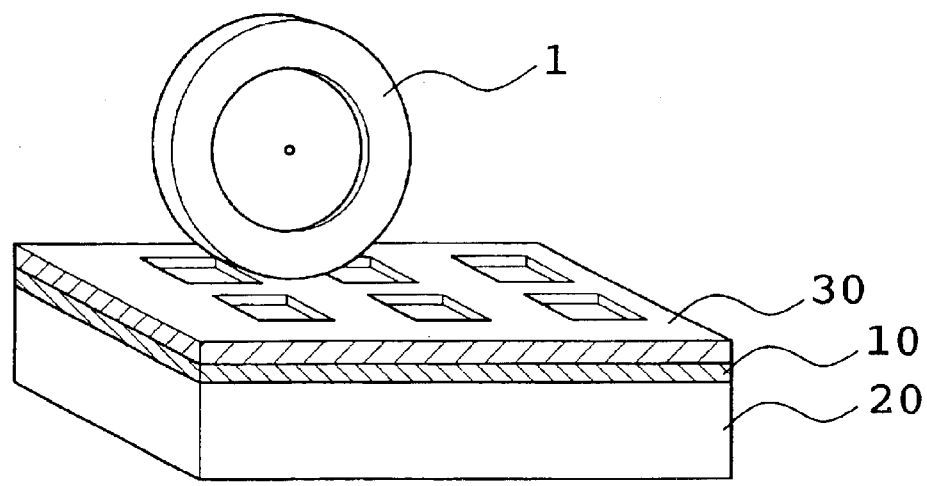
FIG. 8 is a typical view showing ohmic electrode formation according to the second embodiment of the present invention.

FIG. 8 is a schematic view of an electrode selectively formed on a specific region of the semiconductor substrate in a second embodiment of the present invention.

The processing flow of the second embodiment is the same as that of the first embodiment (FIGS. 7A to 7C), but a metal mask 30 is used in order that the electrode may selectively be formed on the semiconductor substrate 20. The metal mask 30 is previously patterned and open at a region where an electrode is selectively formed. In a method of forming the metal mask 30, a metal material is first deposited on the semiconductor substrate 20 by a sputtering apparatus or the like. Thereafter, a resist is patterned on the metal material by the lithographic technique, so that a resist pattern which is open at the region where the electrode is formed is formed. A part of the metal material exposed from the opening of the resist pattern is removed by the dry etching to be formed into the metal mask 30.

<Third Embodiment>

Figure 9:
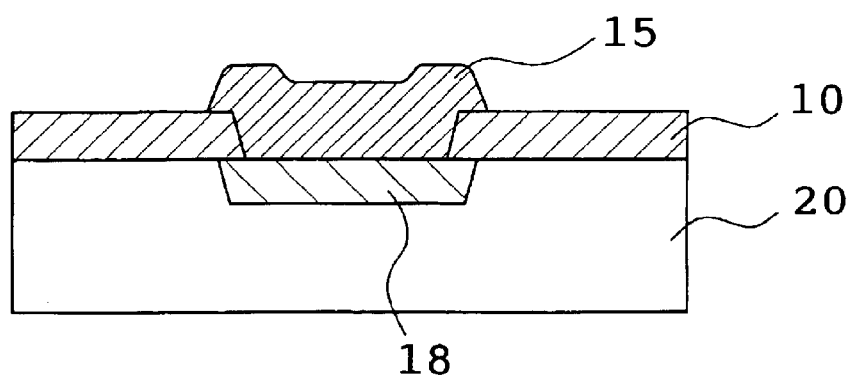
FIG. 9 is a typical view showing ohmic electrode formation according to the third embodiment of the present invention.

FIG. 9 is a sectional view of the semiconductor substrate in a third embodiment in the case where $n^+$ or $p^+$ layers simultaneously formed on the electrode forming portion.

The electrode forming method in the third embodiment is the same as that in the first embodiment, but the electrode material is selected so as to become an n-type or p-type dopant when diffused inside the semiconductor substrate 20.

The n-type dopant includes Ti (titanium) etc., whereas the p-type dopant includes Al (aluminum), In (indium), etc.

In each of the foregoing embodiments, the ohmic electrode can be formed without employing the etching step for electrode formation, the step of depositing electrode material using the PCV or CVD apparatus and the heat-treating step such as sintering after the electrode formation.

In each of the foregoing embodiments, the case where the rotator 1 as shown in FIG. 1A is used is shown, but the same effect can be achieved when the rotator as shown in FIG. 2 or the oscillator as shown in FIG. 3 is used.

Furthermore, the ohmic electrode may be formed on the surface of a semiconductor element by the same method, instead of the semiconductor substrate 20.

What is claimed is:

1. A method of forming at least one electrode on a surface of a semiconductor, wherein a metal or alloy for the electrode is rubbed against a predetermined region of the semiconductor surface so as to be adhered by frictional force and frictional heat to the predetermined region of the semiconductor as an electrode.

2. The method of claim 1, wherein part of the adhered metal or a metal of the alloy is diffused into an inside of the semiconductor by the frictional heat thereby to be formed into an ohmic electrode substantially simultaneously when the metal or alloy is adhered by the frictional force and frictional heat to the predetermined region of the semiconductor.

3. The method of claim 1, wherein the adhered electrode portion is heat-treated after the metal or alloy has been adhered by the frictional force and frictional heat to the predetermined region of the semiconductor as the electrode.

4. The method of claim 1, wherein the metal or alloy is rotated so as to be brought into contact with the semiconductor surface as a technique for causing the frictional force and frictional heat.

5. The method of claim 4, wherein the metal or alloy for the electrode is provided at least on an outer periphery of a rotator.

6. The method of claim 4, wherein the metal or alloy for the electrode is formed into a brush shape.

7. The method of claim 4, wherein the metal or alloy for the electrode is provided at least on one side of a rotator.

8. The method of claim 1, wherein the metal or alloy is oscillated so as to be brought into contact with the semiconductor surface as a technique for causing the frictional force and frictional heat.

9. The method of claim 1, wherein the metal for the electrode becomes an n-type or p-type dopant for the semiconductor.

10. A method of forming at least one electrode on a surface of a semiconductor, comprising:
    a step of providing, on the semiconductor, a metal mask having one or more openings; and
    rubbing a metal or alloy for the electrode against a predetermined region of the semiconductor surface exposed through the openings of the metal mask so that the metal or alloy is adhered by frictional force and frictional heat to the predetermined region of the semiconductor as an electrode.

11. A semiconductor device having at least one electrode formed on a surface thereof by rubbing a metal or alloy for the electrode against a predetermined region of the semiconductor surface so that the metal or alloy is adhered by frictional force and frictional heat to the predetermined region of the semiconductor.

12. The semiconductor device of claim 11, wherein part of a material for the electrode is diffused into an inside of the semiconductor by the frictional heat.

* * * * *